(12) United States Patent
Yamashita

(10) Patent No.: US 9,872,354 B2
(45) Date of Patent: Jan. 16, 2018

(54) LED DRIVE CIRCUIT

(71) Applicant: Sharp Kabushiki Kaisha, Sakai-shi, Osaka (JP)

(72) Inventor: Atsushi Yamashita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/118,181

(22) PCT Filed: Mar. 31, 2015

(86) PCT No.: PCT/JP2015/060172
§ 371 (c)(1),
(2) Date: Aug. 11, 2016

(87) PCT Pub. No.: WO2015/156175
PCT Pub. Date: Oct. 15, 2015

(65) Prior Publication Data
US 2017/0156187 A1 Jun. 1, 2017

(30) Foreign Application Priority Data
Apr. 8, 2014 (JP) ................. 2014-079673

(51) Int. Cl.
*H05B 33/08* (2006.01)
*C09K 11/77* (2006.01)
(Continued)

(52) U.S. Cl.
CPC ...... *H05B 33/0851* (2013.01); *C09K 11/0883* (2013.01); *C09K 11/7734* (2013.01);
(Continued)

(58) Field of Classification Search
CPC ....... H01L 2224/48091; H01L 2924/00; H01L 2224/48465; H01L 2924/00014;
(Continued)

(56) References Cited

U.S. PATENT DOCUMENTS

2003/0230991 A1* 12/2003 Muthu ................ G09G 3/3413
315/307
2006/0273331 A1* 12/2006 Lim ................... H05B 33/0815
257/80
(Continued)

FOREIGN PATENT DOCUMENTS

JP 11-295689 A 10/1999
JP 2005-255895 A 9/2005
(Continued)

OTHER PUBLICATIONS

Author: Miyoshi; Tomonori, Title: Method for Manufacturing Light Emitting Device and Light Emitting Device (JP2015118993A), filed: Dec. 17, 2013 (Original).*
(Continued)

Primary Examiner — Douglas W Owens
Assistant Examiner — Wei Chan
(74) *Attorney, Agent, or Firm* — Keating & Bennett, LLP

(57) ABSTRACT

An LED drive circuit (1) includes a controller (5) which controls a duty ratio of a PWM signal and driving current for driving a blue LED chip (7B) with a blue LED driver (3B) based on blue light, green light, and red light which are received by a photo sensor (4).

4 Claims, 13 Drawing Sheets

(51) Int. Cl.
*C09K 11/08* (2006.01)
*H01L 33/50* (2010.01)
*H01L 25/075* (2006.01)
*G02F 1/1335* (2006.01)
*F21V 8/00* (2006.01)

(52) U.S. Cl.
CPC ..... *G02B 6/0055* (2013.01); *G02F 1/133621* (2013.01); *H01L 25/0753* (2013.01); *H01L 33/502* (2013.01); *H01L 33/507* (2013.01); *H05B 33/0869* (2013.01); *G02F 2001/133614* (2013.01)

(58) Field of Classification Search
CPC .......... H01L 2924/181; H05B 33/0821; H05B 33/0863; H05B 33/0827; H05B 37/02; H05B 33/0806; H05B 33/0866
USPC ... 315/210, 307, 312, 185 R, 250, 291, 360; 257/89, 415, 98; 362/276, 611, 231, 227
See application file for complete search history.

(56) References Cited

U.S. PATENT DOCUMENTS

| | | |
|---|---|---|
| 2007/0108896 A1 | 5/2007 | Hirosaki |
| 2007/0205712 A1* | 9/2007 | Radkov ............. C09K 11/0838 313/503 |
| 2008/0048193 A1 | 2/2008 | Yoo et al. |
| 2008/0303409 A1 | 12/2008 | Hirosaki |
| 2010/0091215 A1 | 4/2010 | Fukunaga et al. |
| 2013/0002157 A1* | 1/2013 | van de Ven ........ H05B 33/0824 315/192 |
| 2013/0264937 A1* | 10/2013 | Sakuta ................ H01L 33/504 313/503 |
| 2015/0171267 A1* | 6/2015 | Miyoshi ................ H01L 33/54 257/98 |

FOREIGN PATENT DOCUMENTS

| | | |
|---|---|---|
| JP | 2006-16413 A | 1/2006 |
| JP | 2006-276784 A | 10/2006 |
| JP | 2010-93132 A | 4/2010 |
| JP | 2013-225708 A | 10/2013 |

OTHER PUBLICATIONS

Author: Miyoshi; Tomonori, Title: Method for Manufacturing Light Emitting Device and Light Emitting Device (JP2015118993A), filed: Dec. 17, 2013 (Translation).*

Official Communication issued in International Patent Application No. PCT/JP2015/060172, dated Jun. 2, 2015.

* cited by examiner

LED DRIVE CIRCUIT

TECHNICAL FIELD

The present invention relates to an LED (Light Emitting Diode) drive device that drives a backlight device which emits white light by mixing colors of blue light, green light, and red light, and the backlight device.

BACKGROUND ART

A backlight device used in a so-called liquid crystal TV (television) is known to have a configuration including a blue LED chip which emits blue light as primary light, a red phosphor which is excited by the blue light to emit red light as secondary light, and a green phosphor which is excited by the blue light to emit green light, and also known to have a configuration including a blue LED chip, a green LED chip which emits green light, and a red LED chip which emits red light. Such backlight device emits white light by mixing colors of blue light, green light, and red light. In recent years, there has been a tendency to extend the color reproduction range that is able to be displayed by a liquid crystal TV, and it has been considered that the latter configuration including the blue LED chip, the green LED chip, and the red LED chip is more desirable in order to realize a high color reproduction range.

However, the latter configuration has a problem that since the blue LED chip, the green LED chip, and the red LED chip have characteristics different from each other, a color shift occurs and it is difficult to maintain white balance.

PTL 1 discloses a configuration in which light quantities of three (red, green, and blue) backlights are measured by three optical sensors and the measured values are compared with set values and subjected to operations so that white balance is maintained at all times regardless of a temperature change or a change over time.

PTL 2 discloses a configuration including light emitting diodes of three colors of red, green, and blue, color sensors corresponding to the respective light emitting diodes, a temperature sensor for measuring temperatures of the light emitting diodes, a control operation unit which corrects a chromaticity change caused by the temperatures of the light emitting diodes and a chromaticity change caused when controlling the brightness of red, green, and blue of the light emitting diodes, and maintaining luminance and chromaticity desirably.

PTL 3 discloses a light emitting element which exhibits white light by exciting a divalent Eu-activated CaAlSiN$_3$ (hereinafter, referred to as a "CASN phosphor") which is a nitride phosphor exhibiting red light emission and a green phosphor exhibiting green light emission with a blue LED emitting blue light.

As a phosphor exhibiting green light emission, for example, a Eu-activated β-SiAlON phosphor indicated in PTL 4 has been conventionally used preferably.

In a case where an illumination device which emits white light by combining a blue LED, a red phosphor, and a green phosphor is used as a backlight light source of a liquid crystal TV, color reproducibility of the liquid crystal TV is likely to be improved by using a phosphor having a narrower peak wavelength of a light emission spectrum.

Thus, in order to realize a display device, such as a liquid crystal TV, capable of displaying deep red, a backlight device indicated in PTL 5 using a Mn$^{4+}$-activated K$_2$SiF$_6$ phosphor (hereinafter, referred to as a "KSF phosphor"), a green phosphor, and a blue LED chip has been developed.

The KSF phosphor has a spectrum of peak wavelength narrower than that of the CASN phosphor and is able to improve color reproducibility more than before.

CITATION LIST

Patent Literature

PTL 1: Japanese Unexamined Patent Application Publication No. 11-295689 (Publication date: Oct. 29, 1999)
PTL 2: Japanese Unexamined Patent Application Publication No. 2006-276784 (Publication date: Oct. 12, 2006)
PTL 3: Japanese Unexamined Patent Application Publication No. 2006-16413 (Publication date: Jan. 19, 2006)
PTL 4: Japanese Unexamined Patent Application Publication No. 2005-255895 (Publication date: Sep. 22, 2005)
PTL 5: Japanese Unexamined Patent Application Publication No. 2010-93132 (Publication date: Apr. 22, 2010)

SUMMARY OF INVENTION

Technical Problem

With the method for emitting white light by mixing colors of the blue LED chip, the green LED chip, and the red LED chip, however, in particular, a luminance change due to a temperature change and luminance reduction due to a change over time are caused, and the LED chips of the respective colors have characteristics different from each other, and therefore it is difficult to maintain the white balance of the white light.

With the method indicated in PTL 1, since each of the backlights uses a cold cathode tube and luminance of the backlights is reduced with a change over time, there is a problem that the white balance is able to be adjusted only in a direction of reducing the luminance, and sufficient correction for a chromaticity change is not achieved.

The method indicated in PTL 2 is limited to adjustment for a temperature change of LEDs and brightness of a backlight and has a problem that it is difficult to predict in advance luminance reduction of the LEDs and a chromaticity change due to a change over time.

FIG. 13 illustrates a light emission spectrum of a CASN phosphor. With a method for emitting white light by using a blue LED chip, a red phosphor, and a green phosphor, only the blue LED chip is to be driven, and therefore a deviation of white balance due to a temperature change or a change over time is small. When the CASN phosphor serving as a red phosphor, which is indicated in PTL 3, is used, however, a wavelength spectrum range of the light emission spectrum is equal to or more than 80 nm as illustrated in FIG. 13, which causes a problem that the red color reproducibility is insufficient.

Similarly, also when the Eu-activated β-SiAlON phosphor serving as the green phosphor, which is indicated in PTL 4, is used, the wavelength spectrum range of the light emission spectrum is equal to or more than 80 nm, similarly to the case of the CASN phosphor, and therefore there is a problem that the color reproducibility of green is insufficient.

Further, when the blue LED chip and the CASN phosphor are used, there is also a problem that it is difficult to change an output (chromaticity) of red light even by changing the duty ratio.

The configuration indicated in PTL 5 has a problem that green color reproducibility is insufficient even though the color reproducibility of red light is able to be improved by the KSF phosphor. There is also a problem that light emission intensities of blue light, red light, and green light change due to a temperature change and a change over time, and accordingly the white balance may be impaired.

Thus, in view of the aforementioned problems, the invention aims to provide an LED drive circuit and a backlight device which are able to maintain white balance regardless of a temperature change and a change over time.

Solution to Problem

In order to solve the aforementioned problems, an LED drive circuit according to an aspect of the invention is an LED drive circuit that drives a backlight device including LEDs each having a light emitting element for emitting primary light; another light emitting element for emitting another primary light; and a phosphor of a forbidden transition type for emitting secondary light excited by the primary light by absorbing a portion of the primary light from the light emitting element. The LED drive circuit includes a driver that drives the light emitting element; another driver that drives the other light emitting element; an optical sensor that receives the primary light emitted by the light emitting element, the other primary light emitted by the other light emitting element, and the secondary light emitted by the phosphor of a forbidden transition type; and an arithmetic processing unit configured to control a duty ratio of a PWM signal for driving the light emitting element with the driver and driving current for driving the light emitting element based on the primary light, the other primary light, and the secondary light which are received by the optical sensor, and controlling a duty ratio of a PWM signal for driving the other light emitting element with the other driver and driving current for driving the other light emitting element based on the primary light, the other primary light, and the secondary light.

In order to solve the aforementioned problems, a backlight device according to an aspect of the invention includes LEDs each having a blue LED chip for emitting blue light, a green LED chip for emitting green light, and a $Mn^{4+}$-activated composite fluorinated compound phosphor for emitting red light by absorbing a portion of the blue light from the blue LED chip.

Advantageous Effects of Invention

An aspect of the invention provides an effect of providing an LED drive circuit and a backlight device which are able to maintain white balance regardless of a temperature change or a change over time.

BRIEF DESCRIPTION OF DRAWINGS

FIG. 7 illustrates graphs indicating luminance characteristics in general of the LED, in which FIG. 7(a) illustrates a relation between a duty ratio and luminance, FIG. 7(b) illustrates a relation between a PWM (Pulse Width Modulation) frequency and luminance, FIG. 7(c) illustrates a relation between a driving current value and luminance, FIG. 7(d) illustrates a relation between an ambient temperature and luminance, and FIG. 7(e) illustrates a relation between a change over time and luminance.

DESCRIPTION OF EMBODIMENTS

Description will hereinafter be given in detail for embodiments of the invention.

Embodiment 1

(Configuration of Backlight Device 2)

Figure 1:
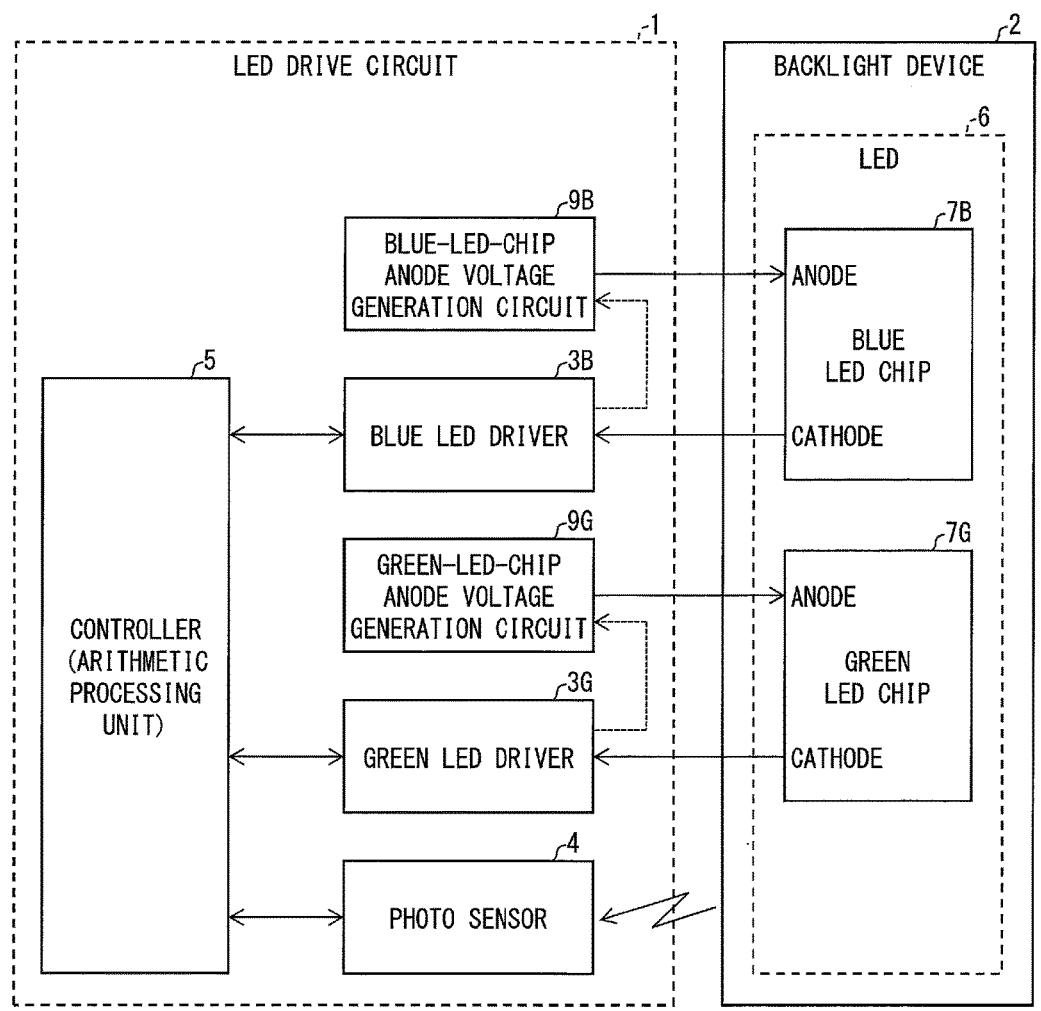
FIG. 1 is a block diagram illustrating a configuration including an LED drive circuit and a backlight device according to Embodiment 1.

FIG. 1 is a block diagram illustrating a configuration of an LED drive circuit 1 and a backlight device 2 according to Embodiment 1. The LED drive circuit 1 drives the backlight device 2. The backlight device 2 has an LED 6. The LED 6 is provided with a blue LED chip (light emitting element) 7B and a green LED chip (another light emitting element) 7G.

Figure 2:
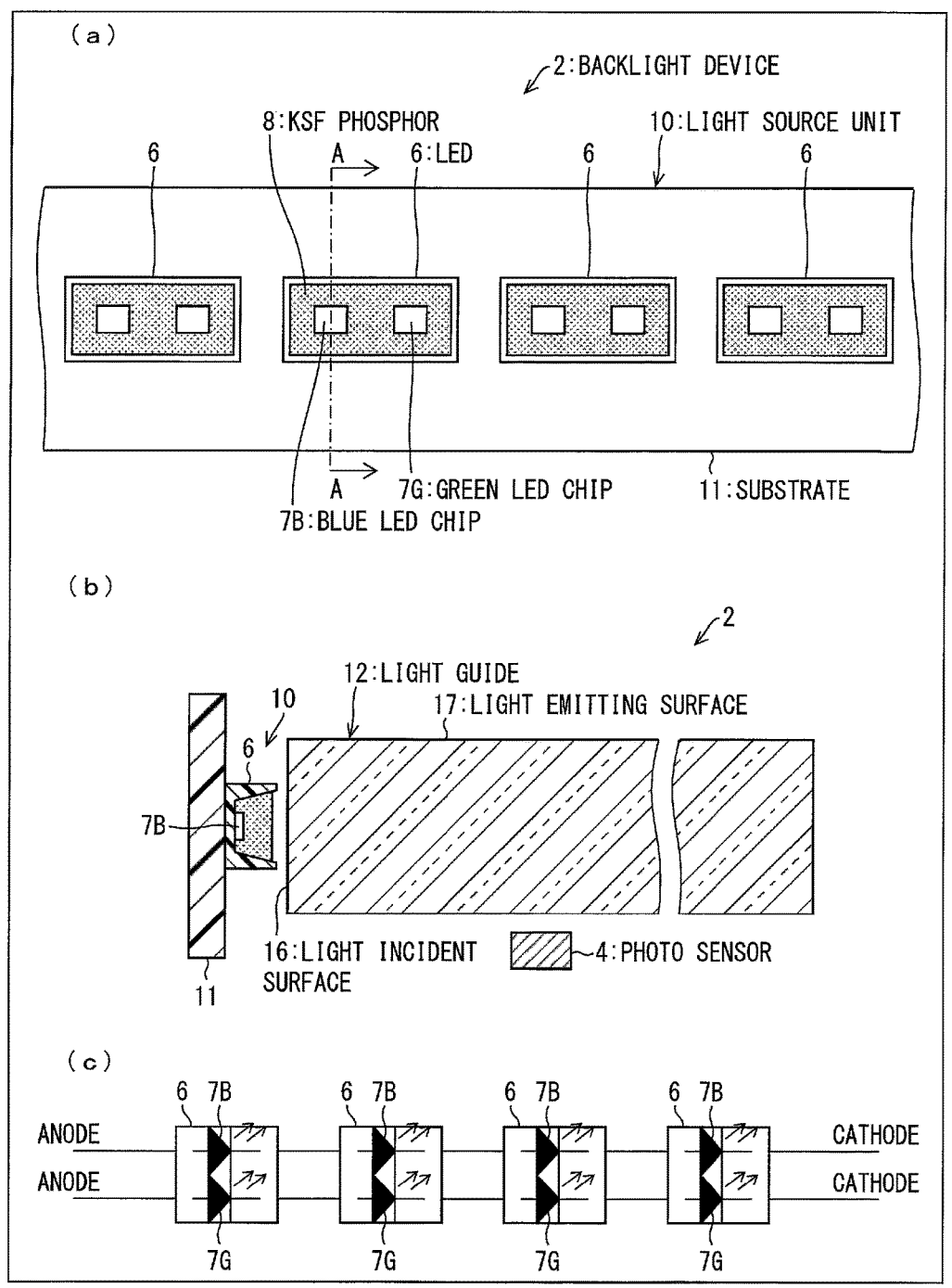
FIG. 2(a) is a plan view of the backlight device.
FIG. 2(b) is a sectional view taken along a plane AA illustrated in FIG. 2(a), and FIG. 2(c) schematically illustrates a connection relation between a plurality of LEDs provided in the backlight device.

FIG. 2(a) is a plan view of the backlight device 2, FIG. 2(b) is a sectional view taken along a plane AA illustrated in FIG. 2(a), and FIG. 2(c) schematically illustrates a connection relation between a plurality of LEDs 6 provided in the backlight device 2.

The backlight device 2 has a substrate 11. The substrate 11 is formed in a thin rectangular shape (strip shape). The plurality of LEDs 6 are aligned in a longitudinal direction on a mounting surface of the substrate 11. On the mounting surface of the substrate 11, printed wiring (not illustrated) is formed for feeding power to the LEDs 6. A positive electrode terminal and a negative electrode terminal (not illustrated) connected to the printed wiring are provided at both ends or one end of the substrate 11. When wiring for feeding power from outside is connected to the positive electrode terminal and the negative electrode terminal, power is fed to the LEDs 6.

Figure 3:
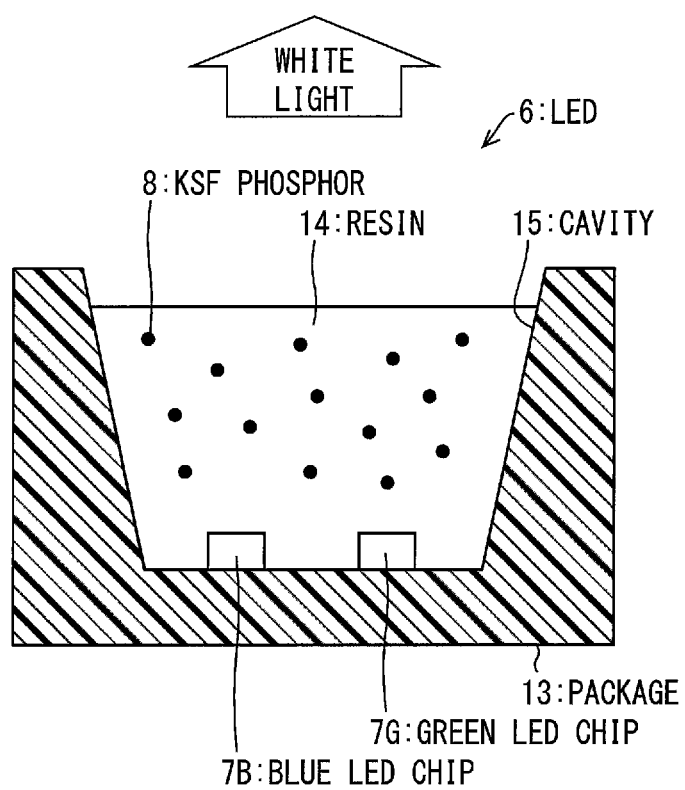
FIG. 3 is a sectional view illustrating a configuration of the LED provided in the backlight device.

FIG. 3 is a sectional view illustrating a configuration of the LED 6 provided in the backlight device 2. The LED 6 has a configuration in which one package has one cabinet, and the LED 6 includes a package 13. A cavity 15 that is a recess is formed in the package 13. The blue LED chip 7B and the green LED chip 7G are mounted on a bottom surface of the cavity 15. The cavity 15 is sealed with a resin 14. A KSF phosphor 8 for emitting red light based on blue light emitted from the blue LED chip 7B is scattered across the resin 14. Blue light emitted from the blue LED chip 7B, green light emitted from the green LED chip 7G, and red light emitted from the KSF phosphor 8 are reflected by an inner side surface of the cavity 15.

The package 13 is made of a nylon-based material and has a lead frame (not illustrated) insert-molded to be exposed on the bottom surface of the cavity 15 formed in the package 13. The inner side surface (reflection surface) of the cavity 15 is preferably formed of a metal film containing Ag or Al having a high reflectance or formed of white silicone so as to reflect light emitted from the blue LED chip 7B and the green LED chip 7G to the outside of the LED 6.

The blue LED chip 7B is, for example, a gallium nitride (GaN) semiconductor light emitting element having a conductive substrate. The blue LED chip 7B has a bottom electrode formed on a bottom surface of the conductive substrate (not illustrated) and has a top electrode formed on the surface opposite thereto (not illustrated). Light (primary light) emitted by the blue LED chip 7B is blue light that falls within a range of 430 nm to 480 nm and has a peak wavelength at about 450 nm. Although the blue LED chip 7B is described here as the LED chip which has electrodes on the top surface and the bottom surface of the conductive substrate, an LED having two electrodes on a top surface may be used.

The green LED chip 7G is, for example, a gallium nitride (GaN) semiconductor light emitting element having a conductive substrate. The green LED chip 7G has a bottom electrode formed on a bottom surface of the conductive substrate (not illustrated) and has a top electrode formed on the surface opposite thereto (not illustrated). Light (another primary light) emitted by the green LED chip 7G is green light that falls within a range of 500 nm to 560 nm and has a peak wavelength at about 530 nm. Although the green LED chip 7G is described here as the LED chip which has electrodes on the top surface and the bottom surface of the conductive substrate, an LED having two electrodes on a top surface may be used.

The cavity 15 is sealed with the resin 14 so as to cover the blue LED chip 7B and the green LED chip 7G. The resin 14 is charged into the cavity 15 to seal the cavity 15 in which the blue LED chip 7B and the green LED chip 7G are arranged. Further, the resin 14 is preferably a silicone resin, because the resin 14 is required to have high durability against short-wavelength primary light. A surface of the resin 14 forms a light emission surface from which light is emitted.

A red phosphor which is excited by the primary light (blue light) emitted from the blue LED chip 7B and emits red light as secondary light is scattered across the resin 14. The red phosphor is, for example, the KSF phosphor (phosphor, red phosphor, Mn$^{4+}$-activated composite fluorinated compound phosphor) 8. The KSF phosphor 8 is a phosphor which emits red light by forbidden transition.

The KSF phosphor 8 is an example of a red phosphor which is scattered across the resin 14 and emits red light by forbidden transition. The KSF phosphor 8 is excited by the blue light which is primary light and emits red secondary light (having a peak wavelength of 600 nm or more and 780 nm or less) that has a longer wavelength than the primary light. The KSF phosphor 8 is a phosphor having a Mn$^{4+}$-activated K$_2$SiF$_6$ structure.

The KSF phosphor 8 has a narrow wavelength range of the peak wavelength of about 30 nm or less and emits red light with high purity.

In addition to the phosphor having the Mn$^{4+}$-activated K$_2$SiF$_6$ structure, a Mn$^{4+}$-activated Mg fluorogermanate phosphor or the like may be used as a material usable as a first red phosphor having a narrow wavelength range of peak wavelength. Further, the first red phosphor that emits red light by forbidden transition may be any of Mn$^{4+}$-activated composite fluorinated compound phosphors represented by the following general expressions (A1) to (A8).

$$A_2[MF_5]:Mn^{4+} \qquad \text{general formula (A1)}$$

(In general formula (A1), A is any of Li, Na, K, Rb, Cs, and NH$_4$, or selected from combinations thereof, and M is any of Al, Ga, and In, or selected from combinations thereof)

$$A_3[MF_6]:Mn^{4+} \qquad \text{general formula (A2)}$$

(In general formula (A2), A is any of Li, Na, K, Rb, Cs, and NH$_4$, or selected from combinations thereof, and M is any of Al, Ga, and In, or selected from combinations thereof)

$$Zn_2[MF_7]:Mn^{4+} \qquad \text{general formula (A3)}$$

(In general formula (A3), M in [ ] is any of Al, Ga, and In, or selected from combinations thereof)

$$A[In_2F_7]:Mn^{4+} \qquad \text{general formula (A4)}$$

(In general formula (A4), A is any of Li, Na, K, Rb, Cs, and NH$_4$, or selected from combinations thereof)

$$A_2[MF_6]:Mn^{4+} \qquad \text{general formula (A5)}$$

(In general formula (A5), A is any of Li, Na, K, Rb, Cs, and NH$_4$, or selected from combinations thereof, and M is any of Ge, Si, Sn, Ti, and Zr, or selected from combinations thereof)

$$E[MF_6]:Mn^{4+} \qquad \text{general formula (A6)}$$

(In general formula (A6), E is any of Mg, Ca, Sr, Ba, and Zn, or selected from combinations thereof, and M is any of Ge, Si, Sn, Ti, and Zr, or selected from combinations thereof)

$$Ba_{0.65}Zr_{0.35}F_{2.70}:Mn^{4+} \qquad \text{general formula (A7)}$$

$$A_3[ZrF_7]:Mn^{4+} \qquad \text{general formula (A8)}$$

(In general formula (A8), A is any of Li, Na, K, Rb, Cs, and NH$_4$, or selected from combinations thereof)

Further, examples of the first red phosphor scattered across the resin 14 include a tetravalent manganese-activated fluoro-tetravalent metalate phosphor substantially represented by general formula (A9) or general formula (A10) below, in addition to the phosphor having the Mn$^{4+}$-activated K$_2$SiF$_6$ structure.

$$MII_2(MIII_{1-b}Mn_h)F_6 \qquad \text{general formula (A9)}$$

In general formula (A9), MII represents at least one alkaline metal element selected from Li, Na, K, Rb, and Cs, and MII is preferably K from the viewpoints of brightness and stability of powder characteristics. In general formula (A9), MIII represents at least one tetravalent metal element selected from Ge, Si, Sn, Ti, and Zr, and MIII is preferably Ti from the viewpoints of brightness and stability of powder characteristics.

In general formula (A9), a value h that represents a composition ratio (concentration) of Mn is $0.001 \leq h \leq 0.1$. This is because when the value h is less than 0.001, a problem arises that sufficient brightness is not obtained, whereas when the value h exceeds 0.1, a problem arises that the brightness greatly decreases due to concentration quenching or the like. From the viewpoints of brightness and stability of powder characteristics, the value h is preferably $0.005 \leq h \leq 0.5$.

Specific examples of the first red phosphor represented by general formula (A9) include, but are not limited to, $K_2(Ti_{0.99}Mn_{0.01})F_6$, $K_2(Ti_{0.9}Mn_{0.1})F_6$, $K_2(Ti_{0.999}Mn_{0.001})F_6$, $Na_2(Zr_{0.98}Mn_{0.02})F_6$, $Cs_2(Si_{0.95}Mn_{0.05})F_6$, $Cs_2(Sn_{0.98}Mn_{0.02})F_6$, $K_2(Ti_{0.88}Zr_{0.10}Mn_{0.02})F_6$, $Na_2(Ti_{0.75}Sn_{0.20}Mn_{0.05})F_6$, $Cs_2(Ge_{0.999}Mn_{0.001})F_6$, and $(K_{0.80}Na_{0.20})_2(Ti_{0.69}Ge_{0.30}Mn_{0.01})F_6$.

$$MIV(MIII_{1-h}Mn_h)F_6 \quad \text{general formula (A10)}$$

In general formula (A10), MIII represents, similarly to the MIII in general formula (A9), at least one tetravalent metal element selected from Ge, Si, Sn, Ti, and Zr, and MIII is preferably Ti for a similar reason. In general formula (A10), MIV represents at least one alkaline earth metal element selected from Mg, Ca, Sr, Ba, and Zn, and MIV is preferably Ca from the viewpoints of brightness and stability of powder characteristics. In general formula (A10), a value h that represents a composition ratio (concentration) of Mn is, similarly to the h in general formula (A9), $0.001 \leq h \leq 0.1$, and is preferably $0.005 \leq h \leq 0.5$ for a similar reason.

Specific examples of the first red phosphor represented by general formula (A10) include, but are of course not limited to, $Zn(Ti_{0.98}Mn_{0.02})F_6$, $Ba(Zr_{0.995}Mn_{0.005})F_6$, $Ca\,Ti_{0.995}Mn_{0.005})F_6$, and $Sr(Zr_{0.98}Mn_{0.02})F_6$.

As illustrated in FIG. 2(c), the blue LED chips 7B are connected in series and the green LED chips 7G are connected in series in a longitudinal direction of the substrate 11 among the plurality of LEDs 6.

(Configuration of Light Guide 12)

Referring back to FIG. 2(b), the backlight device 2 is provided with a light guide 12 so as to cover the plurality of LEDs 6. The light guide 12 is a transparent member which has the overall shape of a rectangular parallelepiped and has a predetermined thickness in a direction perpendicular to the substrate 11. The light guide 12 has a light incident surface 16 on which light emitted from the LEDs 6 is incident. A light emitting surface 17 for surface-emitting the light incident on the light incident surface 16 to extract light is formed in the light guide 12. The light guide 12 is made of a transparent material such as an acrylic.

The substrate 11 and the LEDs 6 constitute a light source unit 10. The light source unit 10 is arranged at a position proximate to the light guide 12 at which a light emission surface of each of the plurality of LEDs 6 faces the light incident surface 16 so that light emitted from the blue LED chip 7B of each of the plurality of LEDs 6 and light emitted from the green LED chip 7G of each of the plurality of LEDs 6 are incident on the light incident surface 16 of the light guide 12.

With reference to FIG. 1 and FIG. 2(b), the LED drive circuit 1 has a photo sensor (optical sensor) 4 on a side opposite the light emitting surface 17 of the light guide 12. The photo sensor 4 receives blue light emitted from the blue LED chip 7B, green light emitted from the green LED chip 7G, and red light emitted from the KSF phosphor 8.

Figure 4:
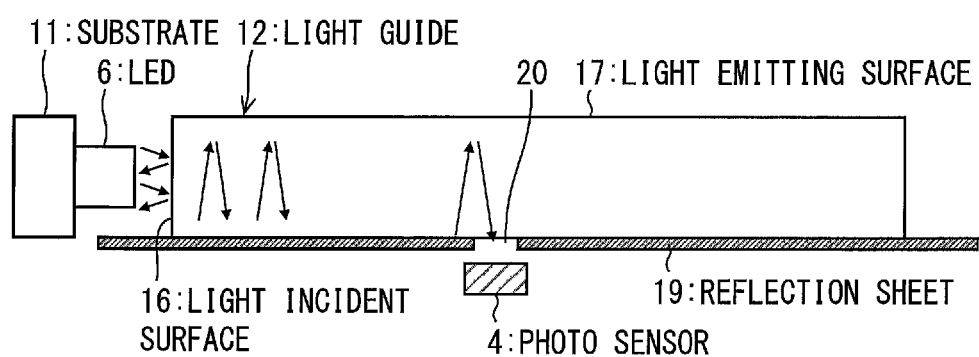
FIG. 4 is a view for explaining a path of light incident on a photo sensor provided in the LED drive circuit.

FIG. 4 is a view for explaining a path of light incident on the photo sensor 4 provided in the LED drive circuit 1. A reflection sheet 19 is provided on a surface opposite the light emitting surface 17 of the light guide 12. A portion of light which is emitted from the LED 6 and is incident on the light guide 12 through the light incident surface 16 is emitted through the light emitting surface 17 of the light guide 12, and the rest of the light is reflected by the light emitting surface 17. The light reflected by the light emitting surface 17 is further reflected by the reflection sheet 19. A portion of the light which is further reflected is emitted through the light emitting surface 17 and the rest of the light is reflected by the light emitting surface 17. Such reflection is repeated.

An opening 20 is formed in the reflection sheet 19. The photo sensor 4 is arranged at a position opposing the opening 20. The aforementioned reflection is repeated and the light other than the light reflected by the light emitting surface 17 is received by the photo sensor 4 through the opening 20 of the reflection sheet 19.

(Configuration of LED Drive Circuit 1)

The LED drive circuit 1 includes a blue-LED-chip anode voltage generation circuit 9B and a green-LED-chip anode voltage generation circuit 9G. The anode voltage generation circuit 9B is connected to an anode terminal to which the plurality of blue LED chips 7B are connected in series and supplies anode voltage needed for lighting up the blue LED chips 7B. The anode voltage generation circuit 9G is connected to an anode terminal to which the plurality of green LED chips 7G are connected in series and supplies anode voltage needed for lighting up the green LED chips 7G. An example of the anode voltage generation circuits 9B and 9G includes a DC/DC converter.

The LED drive circuit 1 includes a blue LED chip driver 3B and a green LED chip driver 3G. The driver 3B is connected to a cathode terminal to which the plurality of blue LED chips 7B are connected in series, and has a function of driving the blue LED chips 7B with fixed current and a function of pulse-driving with a PWM signal. The driver 3B is also connected to a controller (arithmetic processing unit) 5, and is able to desirably change a value of the current flowing through the blue LED chips 7B, a frequency of the PWM signal, and a duty ratio under control from the controller 5.

The driver 3B may have a function of monitoring the voltage of the cathode terminal so that the voltage of the cathode terminal for the blue LED chips 7B is constant and performing feedback to the anode voltage generation circuit 9B to generate optimum anode voltage.

The driver 3G is connected to a cathode terminal to which the plurality of green LED chips 7G are connected in series, and has a function of driving the green LED chips 7G with fixed current and a function of pulse-driving with a PWM signal. The driver 3G is also connected to the controller 5, and is able to desirably change a value of the current flowing through the green LED chips 7G, a frequency of the PWM signal, and a duty ratio under control from the controller 5.

The driver 3G may have a function of monitoring the voltage of the cathode terminal so that the voltage of the cathode terminal of the green LED chips 7G is constant and performing feedback to the anode voltage generation circuit 9G to generate optimum anode voltage.

The photo sensor 4 receives light from the backlight device 2 as described above, and measures intensities of light of blue, green, and red to perform feedback to the controller 5. Examples of the photo sensor 4 include a photo diode and a color sensor. Although only one photo sensor 4 is illustrated in FIG. 1, a plurality of photo sensors 4 may be provided according to a size of the backlight device 2. Three sensors for blue, green, and red may be provided as the photo sensors 4 to perform feedback with respect to the corresponding colors.

In order to maintain white balance as a white point of white light, based on the feedback from the photo sensor 4, the controller 5 verifies whether the intensities of light of blue, green, and red match intensities of light of blue, green, and red, which are set in advance, and when not matching, calculates a correction coefficient by arithmetic processing set in advance, and outputs a signal for changing an IF (forward current (driving current)) value and the duty ratio to the drivers 3B and 3G to correct a deviation of the white balance.

The feedback processing by the controller 5 may be performed at an appropriate time or may be performed under control from outside.

Figure 5:
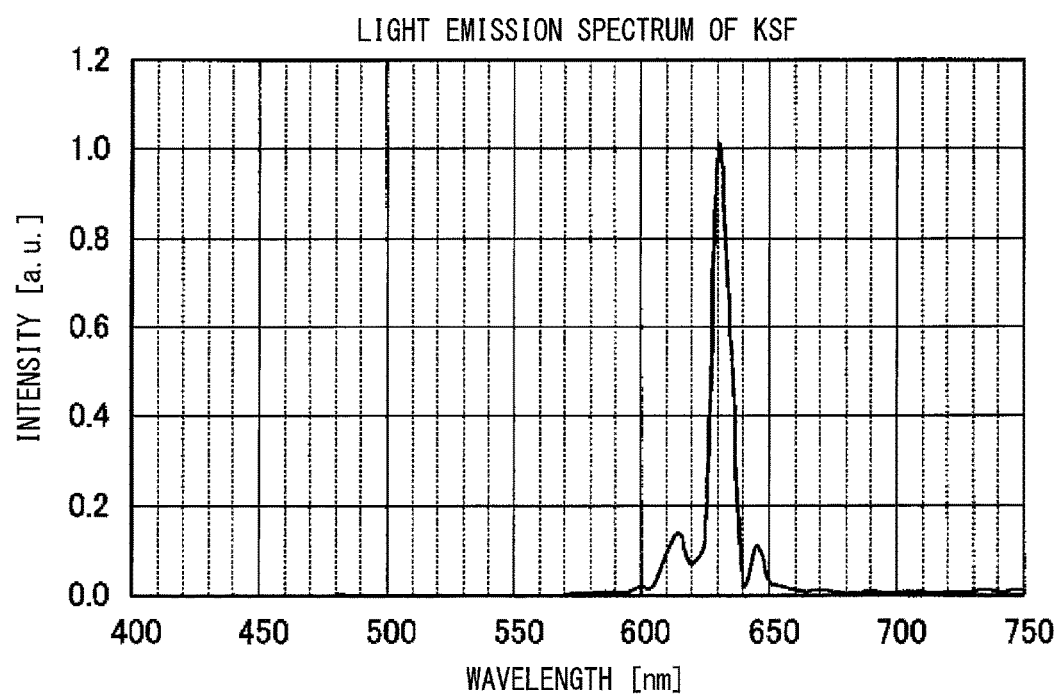
FIG. 5 is a graph indicating a light emission spectrum of a KSF phosphor of the LED.
Figure 13:
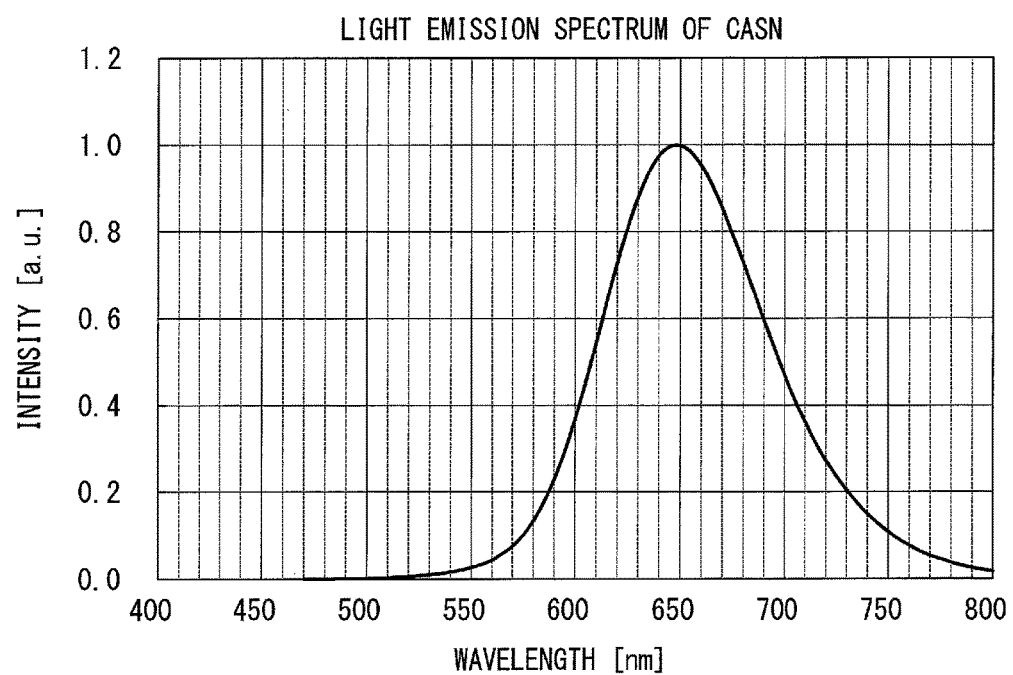
FIG. 13 illustrates a light emission spectrum of a CASN phosphor.

FIG. 5 is a graph indicating a light emission spectrum of the KSF phosphor 8 of the LED 6. As illustrated in FIG. 5 and FIG. 13, it is found that the KSF phosphor 8 which is a phosphor of a forbidden transition type has a narrow spectrum whose peak wavelength range in the vicinity of 630 nm is narrower than that of the CASN phosphor which is a phosphor of an allowed transition type. Like the light emission spectrum of the KSF phosphor 8 illustrated in FIG. 5, the wavelength range of the peak wavelength in the light emission spectrum is preferably about 30 nm or less. In this manner, the light emission spectrum whose wavelength range of the peak wavelength in the light emission spectrum is a narrow spectrum has a lower ratio of including a wavelength range of a color other than a red wavelength range aimed to cause light emission, and the target red wavelength range is separated more clearly from wavelength ranges of other colors. Thus, it is possible to obtain LEDs 6 having high color reproducibility.

(Chromaticity Change of White Light According to Difference of Duty Ratio)

Figure 6:
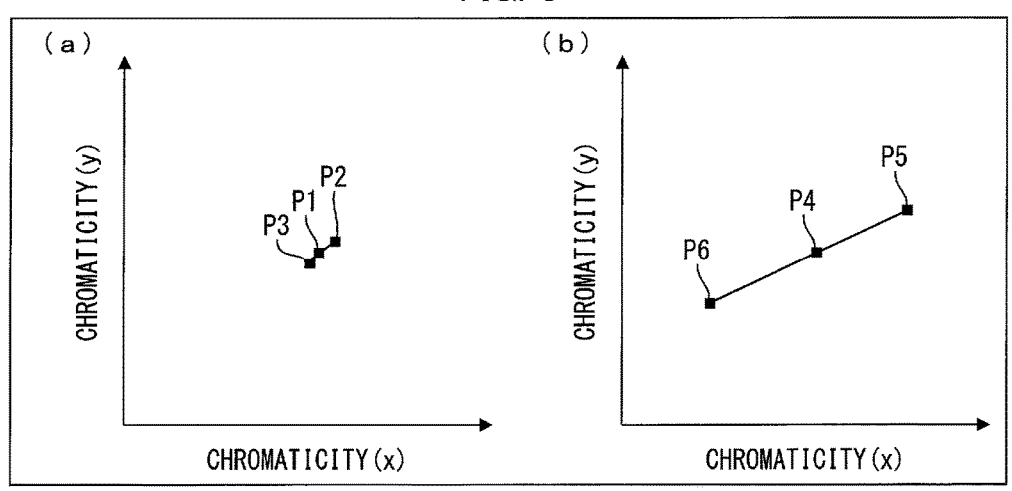
FIG. 6(a) is a graph indicating a chromaticity change of a color mixture of primary light emitted from a blue LED chip when the blue LED chip provided in the LED is pulse-driven and secondary light emitted from a CASN phosphor (red) and an Eu-activated β-SiAlON phosphor (green)
FIG. 6(b) is a graph indicating a chromaticity change of a color mixture of primary light emitted from the blue LED chip when the blue LED chip is pulse-driven and secondary light emitted from a KSF phosphor (red) and the Eu-activated β-SiAlON phosphor (green).

FIG. 6(a) is a graph indicating a chromaticity change of a color mixture of primary light emitted from the blue LED chip 7B when the blue LED chip 7B provided in the LED 6 is pulse-driven and secondary light emitted from a CASN phosphor (red) and an Eu-activated β-SiAlON phosphor (green), and FIG. 6(b) is graph indicating a chromaticity change of a color mixture of primary light emitted from the blue LED chip 7B when the blue LED chip 7B is pulse-driven and secondary light emitted from a KSF phosphor (red) and the Eu-activated β-SiAlON phosphor (green).

Each of points P1 to P3 illustrated in FIG. 6(a) indicates a chromaticity of a color mixture of red light emitted by the CASN phosphor which absorbs a portion of blue light emitted from the blue LED chip 7B which is pulse-driven and green light emitted by the Eu-activated β-SiAlON phosphor.

The point P1 indicates that the chromaticity (x, y) of white light is (0.265, 0.222), when the blue LED chip 7B is pulse-driven with the duty ratio of 50% to obtain white light of a color mixture of light emitted by the CASN phosphor and the Eu-activated β-SiAlON phosphor. The point P2 indicates that the chromaticity (x, y) of white light is (0.2655, 0.2226) in which the chromaticity (x) and the chromaticity (y) when driving with the duty ratio of 50% increase by 0.0005 and 0.0006, respectively, when the blue LED chip 7B is pulse-driven with the duty ratio of 100% to obtain white light of a color mixture of light emitted by the CASN phosphor and the Eu-activated β-SiAlON phosphor. The point P3 indicates that the chromaticity (x, y) of white light is (0.2649, 0.2219) in which both of the chromaticity (x) and the chromaticity (y) when driving with the duty ratio of 50% decrease by 0.0001, when the blue LED chip 7B is pulse-driven with the duty ratio of 10% to obtain white light of a color mixture of light emission by the CASN phosphor and the Eu-activated β-SiAlON phosphor.

In this manner, the chromaticity of white light is almost the same even when the duty ratio is changed from 50% to 100% and the chromaticity of white light is almost the same even when the duty ratio is changed from 50% to 10%.

On the other hand, a chromaticity of a color mixture of the secondary light emitted from the KSF phosphor (red) and the Eu-activated β-SiAlON phosphor (green) and the primary light emitted from the blue LED chip 7B shifts according to a change of the duty ratio. That is, each of points P4 to P6 illustrated in FIG. 6(b) indicates a chromaticity of a color mixture of the primary light emitted from the blue LED chip 7B which is pulse-driven and the secondary light emitted from the KSF phosphor (red) and the Eu-activated β-SiAlON phosphor (green). The point P4 indicates that the chromaticity (x, y) of white light is (0.265, 0.222), when white light is obtained by a color mixture of the primary light when the blue LED chip 7B is pulse-driven with the duty ratio of 50% and the secondary light emitted from the KSF phosphor (red) and the Eu-activated β-SiAlON phosphor (green). The point P5 indicates that the chromaticity (x, y) of white light is (0.268, 0.224) in which the chromaticity (x) and the chromaticity (y) when driving with the duty ratio of 50% increase by 0.003 and 0.002, respectively, when white light is obtained by a color mixture of the primary light when the blue LED chip 7B is pulse-driven with the duty ratio of 10% and the secondary light emitted from the KSF phosphor (red) and the Eu-activated β-SiAlON phosphor (green). The point P6 indicates that the chromaticity (x, y) of white light is (0.262, 0.220) in which the chromaticity (x) and the chromaticity (y) when driving with the duty ratio of 50% decrease by 0.003 and 0.002, respectively, when white light is obtained by the color mixture of the primary light when the blue LED chip 7B is pulse-driven with the duty ratio of 100% and the secondary light emitted from the KSF phosphor (red) and the Eu-activated β-SiAlON phosphor (green).

Chromaticity (x, y) of white light is not limited to the aforementioned examples. An amount of change in the chromaticity when the duty ratio is changed also changes according to a chromaticity, an IF value, an ambient temperature, or the like, so that the aforementioned chromaticity (x, y) of white light is an example.

In this manner, as to the chromaticity (x, y) of white light obtained by the color mixture of the primary light when the blue LED chip 7B is pulse-driven and the secondary light emitted from the KSF phosphor (red) and the Eu-activated β-SiAlON phosphor (green), both of the x and y shift in a plus direction (red side) when the duty ratio for pulse-driving the blue LED chip 7B is reduced, and both of the x and y shift in a minus direction (blue side) when the duty ratio is increased. The KSF phosphor 8 has a narrow spectrum and achieves excellent color reproducibility, but has a slow response speed. Thus, afterglow of the red light of the KSF phosphor 8 increases when the duty ratio is reduced and the chromaticity of the white light shifts to a plus side (red side).

(General Luminance Characteristics of LED)

Figure 7:
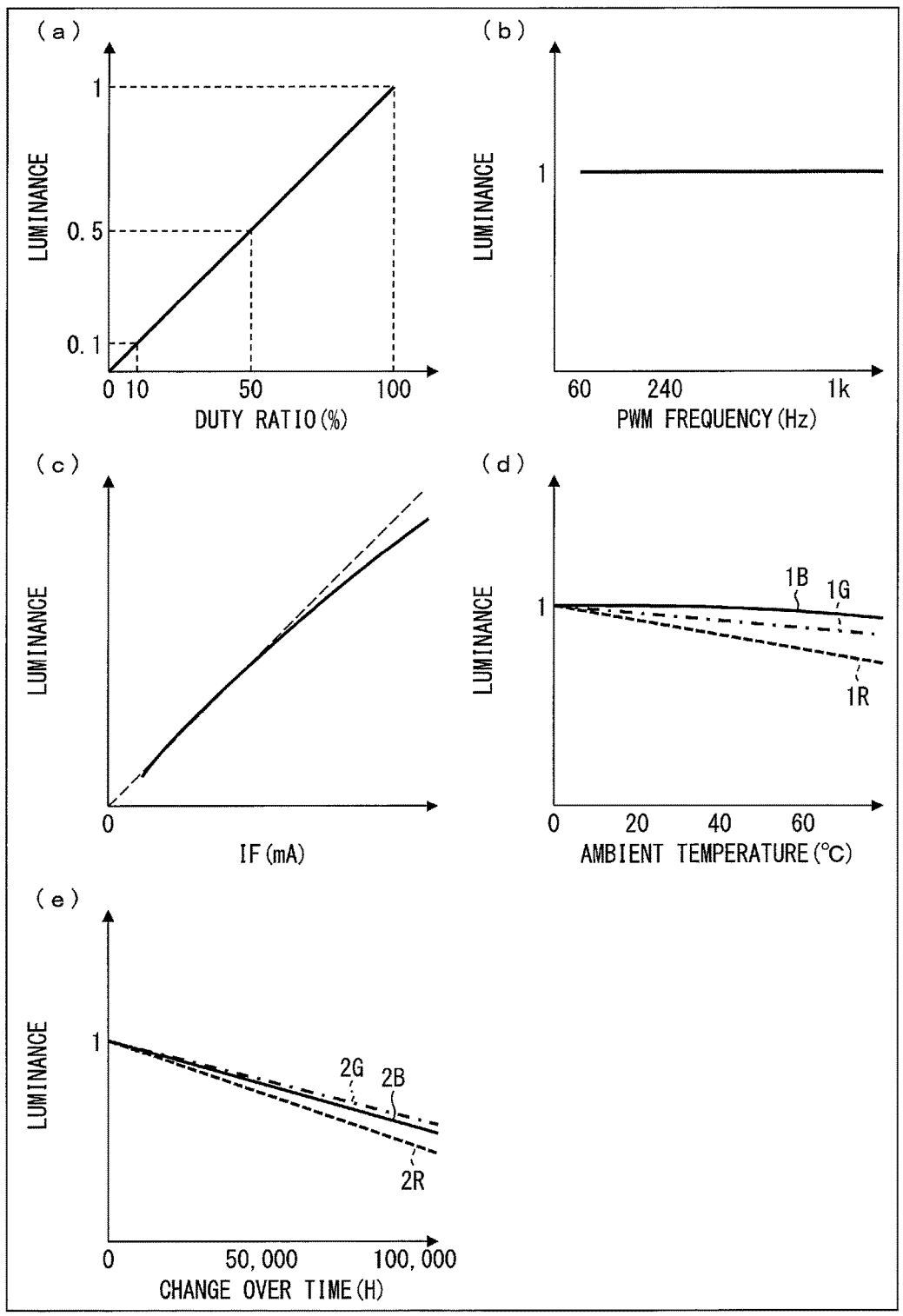

FIG. 7 illustrates a graph indicating general luminance characteristics of LED, in which FIG. 7(a) illustrates a relation between the duty ratio and luminance, FIG. 7(b) illustrates a relation between a PWM frequency and luminance, FIG. 7(c) illustrates a relation between a driving current value and luminance, FIG. 7(d) illustrates a relation between an ambient temperature and luminance, and FIG. 7(e) illustrates a relation between a change over time and luminance.

As illustrated in FIG. 7(a), luminance of light from LED which is pulse-driven is generally proportional to the duty ratio when the LED is pulse-driven.

As illustrated in FIG. 7(b), the luminance of light from the LED is generally constant even when the PWM frequency when the LED is pulse-driven is changed.

As illustrated in FIG. 7(c), when the IF value is increased, the luminance of light from the LED also increases, but efficiency of the luminance with respect to the IF value is lowered.

A curve 1B illustrated in FIG. 7(d) indicates a relation between an ambient temperature and the luminance of the blue LED chip. A curve 1G indicates a relation between an ambient temperature and the luminance of the green LED chip, and a curve 1R indicates a relation between an ambient temperature and the luminance of a red LED chip. It is found that when the ambient temperature rises, luminance of green light and luminance of blue light are particularly reduced as compared to that of blue light. In particular, the luminance of the red light is reduced greatly. That is, when the ambient temperature rises, outputs of luminance of the blue light, the green light, and the red light change and white balance of white light emitted by mixing colors of the blue light, the green light, and the red light is impaired.

A curve 2B illustrated in FIG. 7(e) indicates a relation between a change over time and the luminance of the blue LED chip. A curve 2G indicates a relation between a change over time and the luminance of the green LED chip, and a curve 2R indicates a relation between a change over time and the luminance of the red LED chip. As illustrated in FIG. 7(e), similarly to FIG. 7(d), differences in luminance of the blue light, the green light, and the red light also increase due to a change over time, so that the white balance is impaired.

(Operation of LED Drive Circuit 1)

The LED drive circuit 1 configured as described above operates as follows.

First, the anode voltage generation circuit 9B supplies anode voltage to the anode terminal to which the plurality of blue LED chips 7B of the LEDs 6 are connected, and the anode voltage generation circuit 9G supplies anode voltage to the anode terminal to which the plurality of green LED chips 7G are connected. The driver 3B supplies the PWM signal to the cathode terminal to which the plurality of blue LED chips 7B are connected to pulse-drive the plurality of blue LED chips 7B, and the driver 3G supplies the PWM signal to the cathode terminal to which the plurality of green LED chips 7G are connected to pulse-drive the plurality of green LED chips 7G.

Next, the blue LED chips 7B which are pulse-driven emit blue light and the green LED chips 7G which are pulse-driven emit green light. After that, a portion of the blue light emitted by the blue LED chips 7B is absorbed in the KSF phosphors 8 and the KSF phosphors 8 emit red light. The photo sensor 4 then receives the blue light emitted by the blue LED chips 7B, the red light emitted by the KSF phosphors 8, and the green light emitted by the green LED chips 7G.

Next, based on the blue light, the red light, and the green light received by the photo sensor 4, the controller (arithmetic processing unit) 5 controls a duty ratio of a PWM signal for driving the blue LED chips 7B with the driver 3B and controls driving current for driving the blue LED chips 7B. The controller 5 also controls a duty ratio of a PWM signal for driving the green LED chips 7G with the driver 3G and controls driving current for driving the green LED chips 7G based on the blue light, the red light, and the green light.

In Embodiment 1, when each luminance of the blue LED chips 7B and the green LED chips 7G which are mounted in the LEDs 6 is reduced due to the ambient temperature or a change over time and the white balance is impaired, the output of red light is controlled by changing the duty ratio of the PWM signal for driving the blue LED chips 7B with use of characteristics of the KSF phosphors 8.

Thus, it is possible to improve color reproducibility of a liquid crystal panel by using the blue LED chips 7B, the KSF phosphors 8, and the green LED chips 7G. The output of the red light is adjusted by using characteristics of the KSF phosphors 8 which have a narrow spectrum, but have a slow response speed to change the duty ratio of the PWM signal. As a result, it is possible to provide the LED drive circuit 1 capable of efficiently maintaining the white balance.

(Modified Example of Photo Sensor 4 and Light Guide 12)

Figure 8:
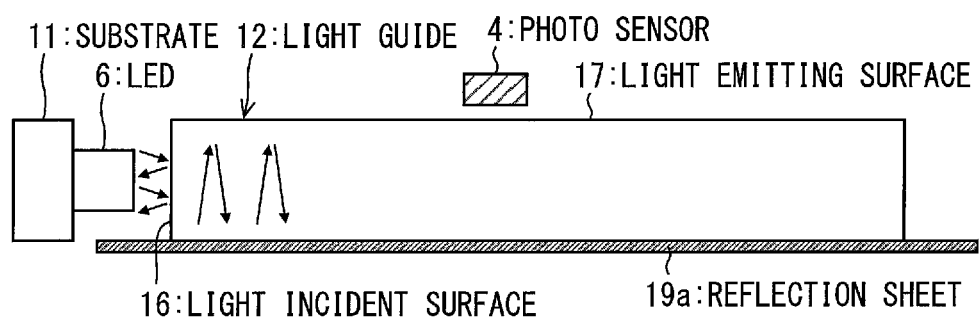
FIG. 8 is a view for explaining another path of light incident on the photo sensor.

FIG. 8 is a view for explaining another path of light incident on the photo sensor 4. In the aforementioned example, an example is indicated in which the reflection sheet 19 in which the opening 20 is formed is provided on the side opposite the light emitting surface 17 of the light guide 12 and the photo sensor 4 is provided on the side opposite the light emitting surface 17. However, the invention is not limited thereto. As illustrated in FIG. 8, a reflection sheet 19a having no opening 20 may be provided on the side opposite the light emitting surface 17 of the light guide 12 and the photo sensor 4 may be arranged on the light emitting surface 17 side.

Figure 9:
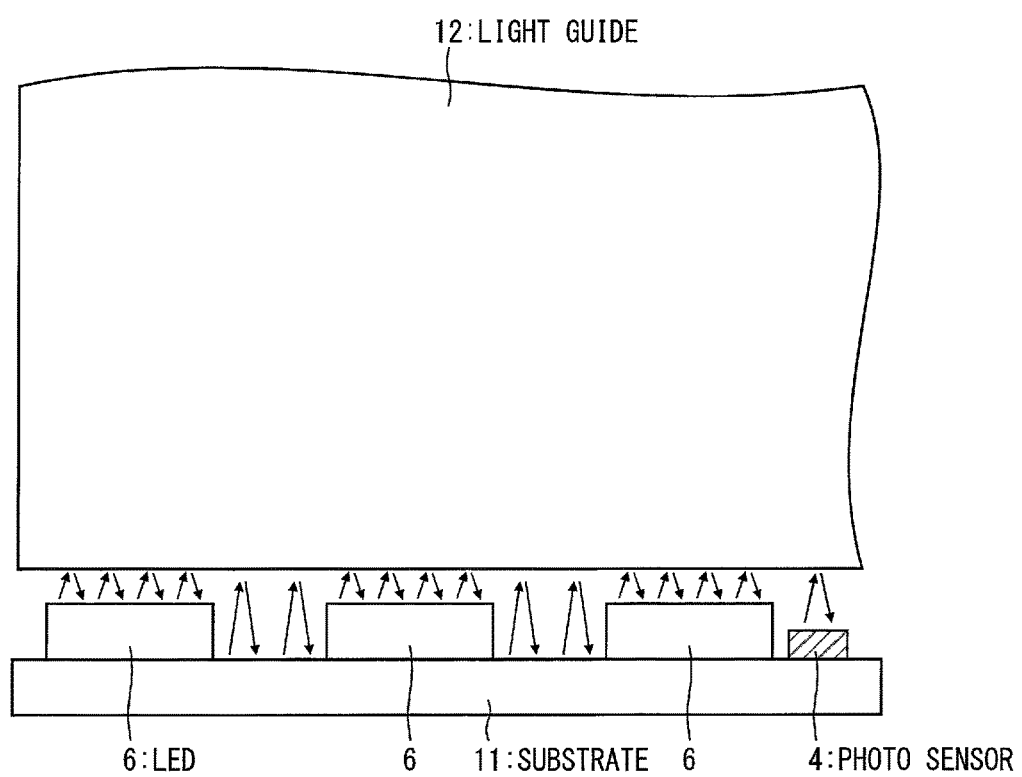
FIG. 9 is a view for explaining still another path of light incident on the photo sensor.

FIG. 9 is a view for explaining still another path of light incident on the photo sensor 4. The photo sensor 4 may be arranged on the surface of the substrate 11. A portion of light emitted from the LEDs 6 enters the light guide 12 and the rest of the light is reflected by the light guide 12. The reflected light is further reflected by the LEDs 6 or the surface of the substrate 11 on which high-reflection resist is formed. A portion of the light which is further reflected enters the light guide 12 and the rest of the light is further reflected by the light guide 12. Such reflection is repeated and the light which is further reflected by the light guide 12 is incident on the photo sensor 4 arranged on the surface of the substrate 11.

The LED drive device 1 according to Embodiment 1 includes: the LEDs 6 each having the blue LED chip 7B which is driven by driving current (IF) which changes according to a signal level of a rectangular wave and emits blue light of luminance corresponding to the IF, the KSF phosphor 8 which is excited by the blue light to emit red light, and the green LED chip 7G which emits green light of luminance corresponding to the IF, and emitting color mixture light of the blue light, the green light, and the red light; the anode voltage generation circuit 9B which generates anode voltage of the blue LED chip 7B; the driver 3B which drives the blue LED chip 7B; the anode voltage generation circuit 9G which generates anode voltage of the green LED chip 7G; the driver 3G which drives the green LED chip; the photo sensor 4 which receives the color mixture light; and the controller 5 which controls the drivers 3B and 3G based on a measurement value of the photo sensor 4.

According to the aforementioned configuration, the blue LED chips 7B and the green LED chips 7G are driven separately. In a case where the blue LED chips 7B are pulse-driven with the PWM signal, when the duty ratio of the PWM signal is reduced based on a measurement value of the photo sensor 4, afterglow of the red light is caused due to characteristics of the KSF phosphors 8 and the chromaticity shifts to the red side. Since the luminance of both the blue light and the red light is reduced when the duty ratio is reduced, the luminance is enhanced by increasing the IF.

To the contrary, when the duty ratio is increased based on a measurement value of the photo sensor 4, the afterglow of the red light decreases and the chromaticity shifts to the blue side. Since the luminance of both the blue light and the red light is increased when the duty ratio is increased, the luminance is reduced by decreasing the IF.

Since the chromaticity of the green LED chips 7G is almost the same even when the duty ratio is changed, the luminance of the green LED chips 7G may be adjusted by the duty ratio or by the IF. However, since light emission efficiency of the green LED chips 7G tends to be lowered in general when the IF increases, it is desirable that the IF is reduced and the duty ratio is increased for the green LED chips 7G.

The LED drive device 1 according to Embodiment 1 uses both the pulse-driving by the PWM signal and the driving with constant current for driving with a fixed IF value when driving the blue LED chips 7B, adjusts an output of red light by changing the duty ratio of the PWM signal based on a measurement value of the photo sensor 4, adjusts entire outputs of blue light and red light by changing the IF value, and performs light emission of white light by color mixing with an output of the green LED chips 7G, to thereby maintain the white balance.

Embodiment 2

Figure 10:
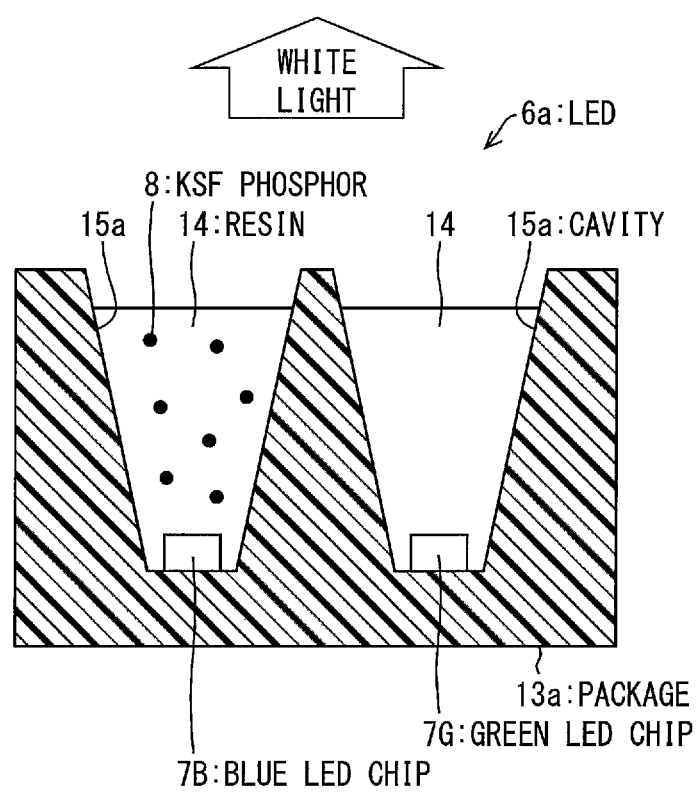
FIG. 10 is a sectional view illustrating a configuration of an LED provided in a backlight device according to Embodiment 2.

FIG. 10 is a sectional view illustrating a configuration of an LED 6a provided in a backlight device according to Embodiment 2. Note that, for convenience of description, the same reference signs will be assigned to members having the same functions as those of the members described in the aforementioned embodiment and description thereof will be omitted.

The LED 6a has a configuration in which one package has two cabinets, and includes a package 13a. A pair of cavities 15a serving as two recesses are formed in the package 13a. The blue LED chip 7B is mounted on a bottom surface of one of the pair of cavities 15a. The green LED chip 7G is mounted on a bottom surface of the other of the pair of cavities 15a. Each of the cavities 15a is sealed with the resin 14.

The KSF phosphor 8 for emitting red light based on blue light emitted from the blue LED chip 7B is scattered across the resin 14 corresponding to the blue LED chip 7B. Blue light emitted from the blue LED chip 7B and red light emitted from the KSF phosphor 8 are reflected by an inner side surface of the cavity 15a corresponding to the blue LED chip 7B. Green light emitted from the green LED chip 7G is reflected by an inner side surface of the cavity 15a corresponding to the green LED chip 7G.

The package 13a is made of a nylon-based material and has a lead frame (not illustrated) insert-molded to be exposed on the bottom surfaces of the pair of cavities 15a formed in the package 13a.

As compared to the LED 6 illustrated in FIG. 3, since the LED 6a has the cavity separated into two cavities 15a, the KSF phosphor 8 is able to be scattered only in the cavity 15a in which the blue LED chip 7B is arranged. Thus, the green light emitted from the green LED chip 7G does not contact with the KSF phosphor 8. Accordingly, it is possible to prevent the green light from the green LED chip 7G from being absorbed by the KSF phosphor 8.

Embodiment 3

FIG. 11(a) is a plan view of a backlight device 2b according to Embodiment 3, and FIG. 11(b) is a sectional view taken along a plane BB illustrated in FIG. 11(a).

The backlight device 2b is a direct-type backlight using a plurality of LEDs 6B and 6G. Each of the LEDs 6B and 6G has a configuration in which two packages have two cabinets. The backlight device 2b has a substrate 11b. Note that, the backlight device 2b also includes an LED drive circuit (refer to FIG. 1), which is not illustrated in FIG. 11, for controlling driving of the plurality of LEDs 6B and 6G.

On a mounting surface of the substrate 11b, on which the plurality of LEDs 6B and 6G are mounted, printed wiring which is not illustrated is formed for feeding power to the LEDs 6B and 6G. A positive electrode terminal and a negative electrode terminal, which are not illustrated, connected to the printed wiring are provided at both ends or one end of the substrate 11b. When wiring for feeding power from outside is connected to the positive electrode terminal and the negative electrode terminal, power is fed to the LEDs 6B and 6G. As illustrated in FIG. 11(a), the plurality of LEDs 6B and 6G are mounted alternately in a matrix pattern on the surface of the substrate 11b. The plurality of LEDs 6B are connected in series and the plurality of LEDs 6G are connected in series.

Figure 11:
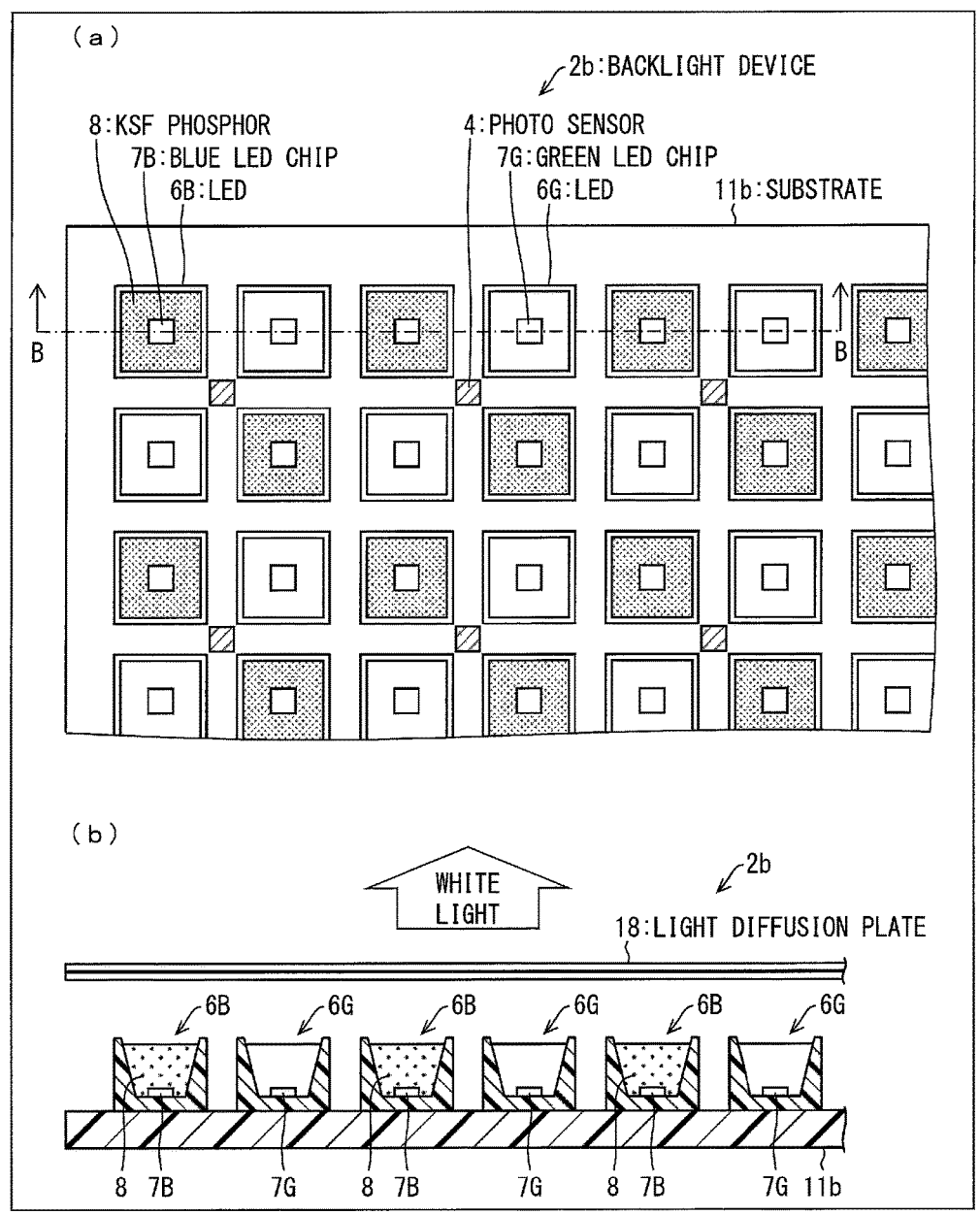
FIG. 11(a) is a plan view of a backlight device according to Embodiment 3.
FIG. 11(b) is a sectional view taken along a plane BB illustrated in FIG. 11(a).

Although the plurality of LEDs 6B and 6G are arranged in a matrix pattern in the example illustrated in FIG. 11, the invention is not limited thereto. The LEDs 6B and 6G may be arranged, for example, in a staggered pattern.

Although the plurality of LEDs 6B and 6G are all arranged at an equal pitch in the example illustrated in FIG. 11, the invention is not limited thereto, and the plurality of LEDs 6B and 6G may be configured so that, for example, four LEDs in total of two LEDs 6B and two LEDs 6G are arranged as one unit and an interval between the units is set to be wider than an interval between the LEDs 6B and 6G included in one unit.

The backlight device 2b is provided with a diffusion plate 18 so as to cover the plurality of LEDs 6B and 6G mounted on the substrate 11b. The diffusion plate 18 is a semitransparent member which is formed in a rectangular plate shape and has a predetermined thickness. The diffusion plate 18 has a function of mixing and uniformizing light emitted from the plurality of LEDs 6B and 6G. Optical sheets (not illustrated) may be arranged on the diffusion plate 18 in order to enhance uniformity of the mixed light.

The photo sensor 4 is provided on the surface of the substrate 11b. The photo sensor 4 receives light which is emitted from the plurality of LEDs 6B and 6G and reflected by the diffusion plate 18, and measures intensities of blue light, green light, and red light to perform feedback to the controller 5. Although one photo sensor 4 is arranged for four LEDs 6B and 6G in total of two LEDs 6B and two LEDs 6G in FIG. 11(a), the invention is not limited thereto.

Figure 12:
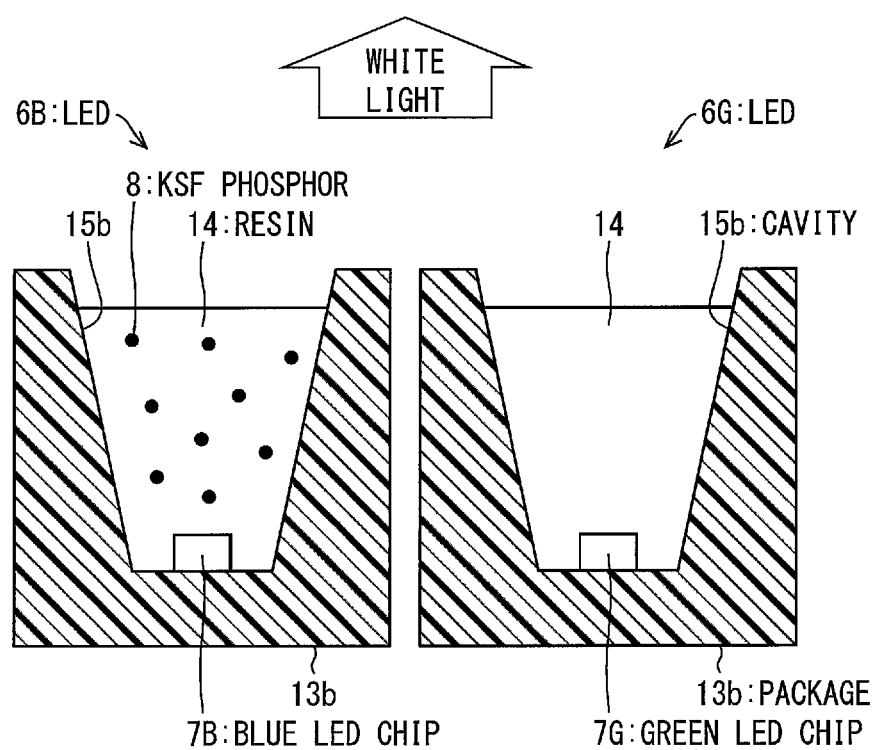
FIG. 12 is a sectional view illustrating a configuration of LEDs provided in the backlight device.

FIG. 12 is a sectional view illustrating a configuration of the LEDs 6B and 6G provided in the backlight device 2b. The LED 6B includes a package 13b. A cavity 15b serving as one recess is formed in the package 13b. The blue LED chip 7B is mounted on a bottom surface of the cavity 15b. The cavity 15b is sealed with the resin 14 so as to cover the blue LED chip 7B. The KSF phosphor 8 is scattered across the resin 14.

The LED 6G also includes a package 13b. A cavity 15b serving as one recess is formed in the package 13b. The green LED chip 7G is mounted on a bottom surface of the cavity 15b. The cavity 15b is sealed with the resin 14 so as to cover the green LED chip 7G.

As compared to the LED 6 described in FIG. 3 and the LED 6a described in FIG. 10, the LEDs 6B and 6G are formed with two packages 13b, thus making it possible to enhance flexibility of arrangement of the blue LED chip 7B corresponding to the LED 6B and the green LED chip 7G corresponding to the LED 6G.

As described above, according to Embodiments 1 to 3, it is possible to improve color reproducibility by using the blue LED chips 7B, the KSF phosphors 8, and the green LED chips 7G. It is possible to provide an LED drive circuit and a back light device, which, with use of characteristics of the KSF phosphors 8 which have a narrow spectrum, but have a slow response speed, are able to adjust an output of red light by changing the duty ratio of the PWM signal based on a measurement value of the photo sensor 4 and efficiently maintain the white balance regardless of a temperature change and a change over time.

The LED drive device according to Embodiments 1 to 3 uses the KSF phosphor having high color rendition, independently drives the blue LED chip and the green LED chip, and emits white light by mixing colors of red light emitted from the KSF phosphor based on blue light from the blue LED chip, the blue light from the blue LED chip, and green light from the green LED chip. With a configuration in which the KSF phosphor emits red light based on the blue light from the blue LED chip, when the duty ratio of the PWM signal for driving the blue LED chip is reduced, afterglow of the red light emitted by the KSF phosphor is generated and, as a result, a chromaticity shifts to the red side. Since luminance of the red light is reduced when the duty ratio is reduced, luminance is enhanced by increasing driving current (IF). That is, when increasing the driving current (IF) simultaneously with reducing the duty ratio, a chromaticity shifts to the red side with luminance of the red light unchanged. To the contrary, when reducing the driving current (IF) simultaneously with increasing the duty ratio of the PWM signal, a chromaticity shifts to the blue side with luminance of the red light unchanged.

By adjusting the driving current (IF) and the duty ratio of the PWM signal for the green LED chip in addition to adjustment of the driving current (IF) and the duty ratio of the PWM signal for the blue LED chip, luminance of the green light is adjusted to correct a shift of a white point.

Thus, it is possible to suppress reduction in luminance after adjustment of the white balance with a change over time.

In this manner, by combining the blue LED chip, the red phosphor generating afterglow when driving with the duty ratio, and the green LED chip, it is possible to suppress reduction in the intensity of white light with a change over time. That is, the blue LED chip and the green LED chip are driven independently, and white light is emitted by mixing colors of red light of the KSF phosphor based on the blue LED chip, blue light from the blue LED chip, and green light from the green LED chip. When luminance of the blue LED chip and the green LED chip is reduced with a temperature change or a change over time and the white balance is impaired, the chromaticity of blue and red is adjusted by duty-driving the blue LED chip by using characteristics of shift of a chromaticity of the KSF phosphor with duty-drive. Although luminance changes when the duty ratio is changed, the change of the luminance is able to be suppressed by changing the driving current (IF).

CONCLUSION

An LED drive circuit 1 according to an aspect 1 of the invention is an LED drive circuit 1 that drives a backlight device 2 including LEDs 6 each having a light emitting element (blue LED chip 7B) for emitting primary light (blue light); another light emitting element (green LED chip 7G) for emitting another primary light (green light); and a phosphor (KSF phosphor 8) of a forbidden transition type for emitting secondary light (red light) excited by the primary light (blue light) by absorbing a portion of the primary light (blue light) from the light emitting element (blue LED chip 7B). The LED drive circuit 1 includes: a driver (blue LED driver 3B) that drives the light emitting element (blue LED chip 7B); another driver (green LED driver 3G) that drives the other light emitting element (green LED chip 7G); an optical sensor (photo sensor 4) that receives the primary light (blue light) emitted by the light emitting element (blue LED chip 7B), the other primary light (green light) emitted by the other light emitting element (green LED chip 7G), and the secondary light (red light) emitted by the phosphor of a forbidden transition type (KSF phosphor 8); and an arithmetic processing unit (controller 5) configured to control a duty ratio of a PWM signal for driving the light emitting element (blue LED chip 7B) with the driver (blue LED driver 3B) and driving current for driving the light emitting element (blue LED chip 7B) based on the primary light (blue light), the other primary light (green light), and the secondary light (red light) which are received by the optical sensor (photo sensor 4), and to control a duty ratio of a PWM signal for driving the other light emitting element (green LED chip 7G) with the other driver (green LED driver 3G) and driving current for driving the other light emitting element (green LED chip 7G) based on the primary light (blue light), the other primary light (green light), and the secondary light (red light).

According to the aforementioned configuration, when luminance of the light emitting element and luminance of the other light emitting element are reduced due to an ambient temperature or a change over time and white balance is impaired, it is possible to maintain the white balance by controlling an output of the secondary light by changing the duty ratio of the PWM signal for driving the light emitting element with use of characteristics of the phosphor. As a result, it is possible to provide an LED drive circuit capable of maintaining the white balance regardless of a temperature change and a change over time.

The LED drive circuit 1 according to an aspect 2 of the invention may be configured such that, in the aspect 1, the light emitting element is a blue LED chip that emits blue light, the phosphor of a forbidden transition type has a red phosphor that emits red light excited by the blue light emitted from the blue LED chip, and the other light emitting element is a green LED chip that emits green light.

According to the aforementioned configuration, when luminance of the blue LED chip and luminance of the green LED chip are reduced due to an ambient temperature or a change over time and white balance is impaired, it is possible to maintain the white balance by controlling an output of the red light by changing the duty ratio of the PWM signal for driving the blue LED chip with use of characteristics of the red phosphor. As a result, it is possible to provide an LED drive circuit capable of maintaining the white balance regardless of a temperature change and a change over time.

The LED drive circuit 1 according to an aspect 3 of the invention may be configured such that, in the aspect 2, the red phosphor is a $Mn^{4+}$-activated composite fluorinated compound phosphor.

According to the aforementioned configuration, when luminance of the blue LED chip 7B and luminance of the green LED chip 7G are reduced due to an ambient temperature or a change over time and white balance is impaired, it is possible to maintain the white balance by controlling an output of the red light by changing the duty ratio of the PWM signal for driving the blue LED chip 7B with use of characteristics of the $Mn^{4+}$-activated composite fluorinated compound phosphor (KSF phosphor) 8. As a result, it is possible to provide an LED drive circuit capable of maintaining the white balance regardless of a temperature change and a change over time.

The LED drive circuit 1 according to an aspect 4 of the invention may be configured such that, in the aspect 2, a chromaticity of a color mixture of the blue light emitted from the blue LED chip 7B and the red light emitted from the red phosphor (KSF phosphor 8) shifts toward a blue side when the duty ratio of the PWM signal for driving the light emitting element (blue LED chip 7B) with the driver (blue LED driver 3B) is increased, and shifts toward a red side when the duty ratio is reduced; the chromaticity is adjusted by controlling the duty ratio of the PWM signal for driving the light emitting element (blue LED chip 7B) with the driver (blue LED driver 3B); and luminance of the primary light is adjusted by controlling the driving current for driving the light emitting element (blue LED chip 7B).

According to the aforementioned configuration, it is possible to adjust the chromaticity of the color mixture of the blue light and the red light by changing the duty ratio of the PWM signal with use of characteristics of the red phosphor.

A backlight device according to an aspect 5 of the invention includes LEDs each having a blue LED chip that emits blue light, a green LED chip that emits green light, a $Mn^{4+}$-activated composite fluorinated compound phosphor that emits red light by absorbing a portion of the blue light from the blue LED chip.

According to the aforementioned configuration, when luminance of the blue LED chip and luminance of the green LED chip are reduced due to an ambient temperature or a change over time and white balance is impaired, it is possible to maintain the white balance by controlling an output of the red light by changing the duty ratio of the PWM signal for driving the blue LED chip with use of characteristics of the $Mn^{4+}$-activated composite fluorinated compound phosphor. As a result, it is possible to provide an LED drive circuit capable of maintaining the white balance regardless of a temperature change and a change over time.

The invention is not limited to each of the embodiments described above and can be modified variously within the scope defined by the claims, and embodiments obtained by appropriately combining technical means disclosed in different embodiments are also included in the technical scope of the invention. Further, by combining the technical means disclosed in each of the embodiments, a new technical feature may be formed.

INDUSTRIAL APPLICABILITY

The invention is usable for an LED drive device that drives a backlight device which emits white light by mixing colors of blue light, green light, and red light, and the backlight device.

The invention is also usable for a backlight device that extends color reproducibility of a liquid crystal TV.

REFERENCE SIGNS LIST

1 LED drive circuit
2 backlight device
3B blue LED chip driver (driver)
3G green LED chip driver (another driver)
4 photo sensor (optical sensor)
5 controller (arithmetic processing unit)
6 LED
7B blue LED chip (light emitting element)
7G green LED chip (another light emitting element)
8 KSF phosphor
9B blue-LED-chip anode voltage generation circuit
9G green-LED-chip anode voltage generation circuit

The invention claimed is:

1. An LED drive circuit that drives a backlight device including LEDs each including a first light emitting element that emits a first primary light; a second light emitting element that emits a second primary light; and a phosphor of a forbidden transition type that emits secondary light excited by the first primary light by absorbing a portion of the first primary light from the first light emitting element, the LED drive circuit comprising:
a first driver that drives the first light emitting element;
a second driver that drives the second light emitting element;
an optical sensor that receives the first primary light emitted by the first light emitting element, the second primary light emitted by the second light emitting element, and the secondary light emitted by the phosphor of a forbidden transition type; and
an arithmetic processor that controls a duty ratio of a PWM signal to drive the first light emitting element with the first driver and driving current to drive the first light emitting element based on the first primary light, the second primary light, and the secondary light which are received by the optical sensor, and to control a duty ratio of a PWM signal to drive the second light emitting element with the second driver and driving current to drive the second light emitting element based on the first primary light, the second primary light, and the secondary light, wherein
when intensities of the first primary light, the second primary light, and the secondary light that are received by the optical sensor do not match intensities of the first primary light, the second primary light, and the secondary light that are set in advance, in order to correct a deviation of white balance, the arithmetic processor (i) changes, based on a correction coefficient calculated by arithmetic processing performed in advance, the duty ratio of the PWM signal to drive the first light emitting element with the first driver and the driving current to drive the first light emitting element, and (ii) changes, based on the correction coefficient calculated by arithmetic processing performed in advance, the duty ratio of the PWM signal to drive the second light emitting element with the second driver and the driving current to drive the second light emitting element.

2. The LED drive circuit according to claim 1, wherein the first light emitting element is a blue LED chip that emits blue light,
the phosphor of a forbidden transition type has a red phosphor that emits red light excited by the blue light emitted from the blue LED chip, and
the second light emitting element is a green LED chip that emits green light.

3. The LED drive circuit according to claim 2, wherein the red phosphor is a $Mn^{4+}$-activated composite fluorinated compound phosphor.

4. The LED drive circuit according to claim 2, wherein a chromaticity of a color mixture of the blue light emitted from the blue LED chip and the red light emitted from the red phosphor shifts toward a blue side when the duty ratio of the PWM signal to drive the first light emitting element with the first driver is increased, and shifts toward a red side when the duty ratio is reduced, and the chromaticity is adjusted by controlling the duty ratio of the PWM signal to drive the first light emitting element with the first driver, and luminance of the first primary light is adjusted by controlling the driving current to drive the first light emitting element.

* * * * *